United States Patent [19]

Sater

[11] Patent Number: 4,516,314

[45] Date of Patent: May 14, 1985

[54] METHOD OF MAKING A HIGH INTENSITY SOLAR CELL

[76] Inventor: Bernard L. Sater, 9007 Westlawn Blvd., Olmsted Falls, Ohio 44138

[21] Appl. No.: 590,331

[22] Filed: Mar. 16, 1984

Related U.S. Application Data

[60] Continuation of Ser. No. 539,546, Oct. 6, 1983, abandoned, which is a division of Ser. No. 327,567, Dec. 4, 1981, Pat. No. 4,409,422, which is a continuation of Ser. No. 53,923, Jul. 2, 1979, abandoned, and Ser. No. 522,244, Nov. 8, 1974, abandoned.

[51] Int. Cl.$^3$ .............................................. H01L 31/18
[52] U.S. Cl. ..................................... 29/572; 29/576 J; 29/583; 29/589; 29/590; 29/591
[58] Field of Search ....................... 29/572, 576 J, 583, 29/589–591; 136/244, 255, 256, 259; 357/30

[56] References Cited

U.S. PATENT DOCUMENTS

| | | | |
|---|---|---|---|
| 3,422,527 | 1/1969 | Gault | 29/572 |
| 3,653,971 | 4/1972 | Lidorenko et al. | 136/244 |
| 3,690,953 | 9/1972 | Wise | 136/255 |

*Primary Examiner*—Aaron Weisstuch
*Attorney, Agent, or Firm*—Yount & Tarolli

[57] ABSTRACT

A method of manufacturing a high intensity edge illuminated solar cell is provided which comprises the following steps. A semiconductor substrate is formed having first, second and third essentially parallel layers having impurity doped semiconductor material and arranged in that order with the first and third layers terminating in opposing essentially parallel first and second major surfaces. The second layer is of a first type conductivity and the first layer is an opposite second type conductivity so as to define a PN junction between the first and second layers and which junction is essentially parallel to the first and second major surfaces. The third layer is of the first type conductivity but is of greater impurity concentration than that of the second layer for providing a built-in electrostatic drift field to enhance minority carrier movement toward the PN junction. The junction of the second and third layers is essentially parallel to the PN junction. First and second ohmic contact layers are applied on the first and second major surfaces respectively so as to provide electrical contacts thereon. The substrate is separated along separating planes into segments. These separating planes provide major working surfaces extending between the first and second major surfaces. The major working surfaces each contain a plurality of edge surfaces of the first, second and third impurity doped semiconductor material. The major working surfaces of each segment are prepared by passivating the edge surfaces of the first, second and third impurity doped material. At least one of the major working surfaces serves to receive incident radiation and thereby it serves as an operating surface. An accumulation layer is incorporated at the operating surface containing the first type conductivity semiconductor material to provide thereat a drift field to minimize minority carrier recombination at the operating surface.

11 Claims, 7 Drawing Figures

RADIATION

METHOD OF MAKING A HIGH INTENSITY SOLAR CELL

This is a continuation of application Ser. No. 539,546 filed Oct. 6, 1983 now abandoned which was a divisional of Ser. No. 327,567 filed Dec. 4, 1981 now U.S. Pat. No. 4,091,422, which was a continuation of Ser. No. 053,923 filed July 2, 1979 now abandoned and Ser. No. 522,244 filed Nov. 8, 1974 now abandoned.

BACKGROUND OF THE INVENTION

1. Field of Invention

This invention relates to improvement in photoelectric generators for conversion of radiation into electrical energy and more specifically to such a semiconductor converter which will produce a relatively high power output under high intensity radiation levels and to methods of their manufacture.

2. Description of the Prior Art

There are a variety of energy sensitive devices that are extensively utilized to convert energy from one form to another; for example, the single crystal silicon photovoltaic cell, or silicon solar cell as it is herein referred to, has been successfully employed to convert incident solar radiation energy into electrical energy. Conventional silicon solar cells are well known and in extensive common use primarily because they provide relatively high conversion efficiencies compared to other energy conversion devices that are presently available. Because of this, the silicon solar cell has been used in the form of large flat solar arrays for terrestrial and space power aplications with electrical power output reaching the kilowatt level.

In conventional solar arrays, the cost of the silicon solar cells has been a predominant system cost factor and it has been recognized that cost savings can be achieved by using concentrators or reflectors to increase the intensity of incident radiation, thus providing increased power outputs per unit solar cell area. However, at high intensities, the conventional silicon solar cell in general suffers from the disadvantages of low efficiency, low voltage and current densities, and low level of radiation intensity at which saturation current (and power) is attained, so that the requisite efficiency of energy conversion at high radiation intensities is not obtained.

The prime means of maximizing the performance of the conventional silicon solar cell for high radiation intensities is to minimize its effective series resistance. The design considerations for silicon solar cells of the conventional type for high intensities have been exemplified in a technical paper by Lewis et al., (Solar Cell Characteristics at High Solar Intensities and Temperatures by C. A. Lewis and J. P. Kirkpatrick, IEEE 8th Photovoltaic Specialist Conference Proceedings pp. 123-134, Seattle, Wash., Aug. 4, 5, 6, 1970). Briefly, the major considerations are reviewed here and are shown in FIG. 1 which is a representative example of the conventional N on P silicon solar cell configuration in accordance with previous technology. The total internal resistance consists of the sum of various elements, namely, sheet resistance of the upper N layer (for an N on P slar cell), the bulk resistance of the P region, the resistance between the metallic contact and the semiconducting material, and the resistance of the metallic contact. These elements can be represented as lumped resistances except for the N region sheet resistance component which must be considered as a distributed parameter due to the nonuniform current distribution between the current collection metallic contact grids of the upper layer. The current passes uniformly through all the other elements of the silicon solar cell.

Parameters that must be considered in the design of high intensity solar cells of the conventional type are: (a) Sheet resistance and diffusion depth: Sheet resistance has been shown to be the dominating factor in the cell internal impedance. Deep diffusion is required in order to minimize the sheet resistance in this region. However, a decrease in cell sensitivity to the short wavelength energy will occur with deep diffusion because of the photon absorption characteristics of silicon; so a compromise must be made. The conventional solar cell has a diffusion depth in the neighborhood of 0.3 to 0.5 microns and recent improved cells, such as the so called "violet cell", were made by reducing the thickness of the diffused layer to the neighborhood of 0.1 micron. Accordingly, in Lewis and Kirkpatrick article, for the conventional solar cell optimized for high intensity up to 25 "suns", the diffused junction depth was in the region of 0.6 to 0.8 microns; which was considered a reasonable trade off between its spectral response and series resistance. (b) Bulk resistance: This must be made low to minimize the effective series resistance. However, diffusion length, minority carrier lifetime and therefore the short circuit current, $I_{SC}$, will increase as bulk resistivity is increased while open circuit voltage, $V_{OC}$, decreases. At the present time, base resistivities of 0.5 to 10 ohm-cm are commonly used in the conventional solar cell, yielding open circuit voltages in the range of 0.55 to 0.6 volts. Recent technology improvements in conventional solar cells are based on use of lower resistivities of 0.01 ohm-cm to yield even higher open circuit voltages. However, with all these factors in mind and knowing that sheet resistance is a dominating factor, the use of material with a base resistivity of less than 1 ohm-cm is not warranted in Lewis and Kirkpatrick for fabrication of high intensity conventional solar cells. (c) Cell thickness: This should be kept small in order to keep the bulk resistance at a low value. Also, only those excess carriers that are photogenerated within a depth of about a diffusion length from the junction are collected. Therefore, a cell thickness that is much greater than a minority carrier diffusion length will only add excess series resistance without increasing the short circuit current. On the other hand, a lower limit on the cell thickness is placed by limitations of material handling, mounting, thermal dissipation, etc. (d) Grid contacts: In the conventional silicon solar cell for high intensity, the grid design becomes extremely important. It is desired to maximize the current collection efficiency by covering the entire upper surface, but this is not feasible since the grid, being opaque, also blocks illumination and lowers the light gathering efficiency of the cell. Increasing the member of grid lines on the active front surface will minimize the grid contact resistance. Obviously, the closer the grid spacing the shorter the path length that must be traversed by the charge carriers and so the collection efficiency will be enhanced. A limit is imposed however, due to the reduction in the active area directly exposed to the sunlight, so a comprise is necessary. Therefore, for a high intensity solar cell more grids and thicker metalization is used. Whereas the conventional 2 cm×2 cm solar cell has 5 to 7 grids covering only 5 percent of the upper surface, the cell described in Lewis and Kirkpatrick for high intensity has 11 grids on 1 cm×2 on solar cell, with 10 percent of the upper surface being covered.

Radiation incident upon a conventional silicon solar cell may, generally speaking, be considered as consisting of the three fractions: the fraction of the incident radiation reflected at the surface which can be controlled to a large degree by anti-reflection coatings, the fraction absorbed in the semiconductor bulk, and the fraction that is transmitted through the cell and is absorbed in the back side ohmic contact. It is desired to have the highest fraction of incident radiation absorbed in the semiconductor bulk, since radiation which is reflected at the surface is unusable and that which is absorbed in the back side contributes only to heat.

Radiation which enters either the N or P regions of the junction is attenuated in an exponential manner characterized by the absorption coefficient $\alpha$ of the material. In the upper surface that is highly doped the absorption coefficient is high; consequently, minority carriers generated quickly recombine because the life time in this region is extremely short. Thus, this region is essentially a dead layer with very little output response for the short wavelength radiation that is incident on the silicon solar cell.

In the bulk region the absorbed photons will generate electron-hole pairs and those that lie within a diffusion length of the depletion region will likely contribute to output current because they have a chance to reach the junction region. Those generated beyond this region will recombine before they can be separated by the potential barrier associated with the junction region and not contribute to output. In general the spectral response of a typical silicon solar cell reflects the situation discussed above in that the response is degraded in the short wavelength region, peaks at about 0.85 to 0.9 micron, and is again degraded at longer wavelengths up to 1.1 micron, which is the limit with the silicon band gap.

Approximately 25 percent of the sun's energy on the Earth's surface is composed of wavelengths longer than 1.1 micron to which the silicon cannot respond. Thus, this energy is absored in the opaque back contact of the conventional silicon solar cell. The absorbed energy not converted to useful electrical energy is dissipated within the conventional solar cell. The majority of energy is absorbed in the upper surface region, being of short wavelength. The energy absorbed beyond a diffusion length of the junction is again converted to thermal dissipation. Thus, most of the absorbed energy results in thermal dissipation within the solar cell itself. There is a temperature gradient through the solar cell from the upper surface to the heat sink (assuming that the cell is cooled from the back side) that depends on the thermal conductivity and rate of energy flow per unit area.

In consideration of the design limitations discussed above, and the trade offs involved among the design parameters, it is concluded that no significant high intensity gains can be expected from technology improvements on the conventional silicon solar cell.

The high intensity solar cell described in this invention utilizes an edge illuminated or vertical junction structure that has been employed as a photovoltaic cell. Such a structure is described by J. P. Wise in U.S. Pat. No. 3,690,953. The vertical junction hardened solar cell taught by J. P. Wise's patent is not suitable for high intensity applications and is comparatively very expensive to fabricate. The structure taught by John H. Gault in U.S. Pat. No. 3,422,527 as a method of manufacture of high voltage solar cell bears a resemblance to the present invention. However, this invention differs in several important aspects. According to Gault's invention, wafers formed to have photogenerating characteristics by any standard well known manner are employed. In this invention the starting wafers are not found to have suitable photogenerating characteristics by any standard well known manner but differ considerably in that the diffusion depths and bulk resistivities employed would make a rather useless conventional cell by all standard criteria. In addition, according to Gault's invention each wafer is nickel plated on both surfaces, sintered, and then replaced with nickel prior to being assembled into a stack with interposed soldering wafers such as pure tin. Thereafter, the assemblage is placed in a furnace to cause soldering of the nickel plated surfaces. One distinguishing feature of the present invention is that aluminum is employed to allow the silicon wafers, which provides not only better thermal characterstics for high intensity but can be done at lower temperatures than the Ni sintering employed by Gault to help preserve the bulk lifetimes that are essential for efficiency. However, no information or claims are presented in Gault's patent as to aspects concerning high intensity.

According to the present invention, a structure is provided for a photovoltaic cell which results in improved characteristics for conversion of high intensity radiation. The high intensity solar cell in accordance with the invention eliminates most of the problems and design limitations associated with the prior art. The invention also covers methods of manufacturing series-connected arrays of high intensity solar cells at low cost, and a system of concentrating incident radiating into the most sensitive region of the high intensity solar cell for maximizing efficiency. The high intensity solar cell has demonstrated high efficiency and thermal stability under intense solar concentration levels in excess of 250 AMO sun levels.

OBJECTS OF THE INVENTION

It is therefore a prime object of this invention to provide a structure for a photovoltaic cell which results in improved characteristics for high intensity radiation conversion in an efficient manner.

A further object of the invention is methods of manufacturing that permit an economical production of integrally bonded series connected arrays of these high intensity photovoltaic cells.

Still another object of the invention is to provide a lens system that permits incident radiation to be concentrated within the most responsive portion of each high intensity photovoltaic cell to provide maximum efficiency.

BRIEF DESCRIPTION OF THE DRAWINGS

These and other objects and advantages of the present invention will become more apparent upon reference to the accompanying descriptions and drawings in which:

Turning now to FIG. 1, there is shown a conventional solar cell constructed according to the prior art. The solar cell includes a block or wafer (10) of P conductivity type silicon into which N type material has been diffused to form an N-conductivity type region (11), the N and P regions being separated by a P-N junction (12). The majority of the upper radiation receiving surface of the cell is covered with an antireflection coating (13) (tyically SiO). The remainder of the upper surface of the cell is covered by metallic grid lines (14) and an electrical contact strip (15). The lower surface of the cell is also covered with a layer (16) of electrical contact material. The processes by which the conventional solar cell described, is formed are well known to those skilled in the art.

DESCRIPTION OF THE PREFERRED EMBODIMENT

Figure 1:
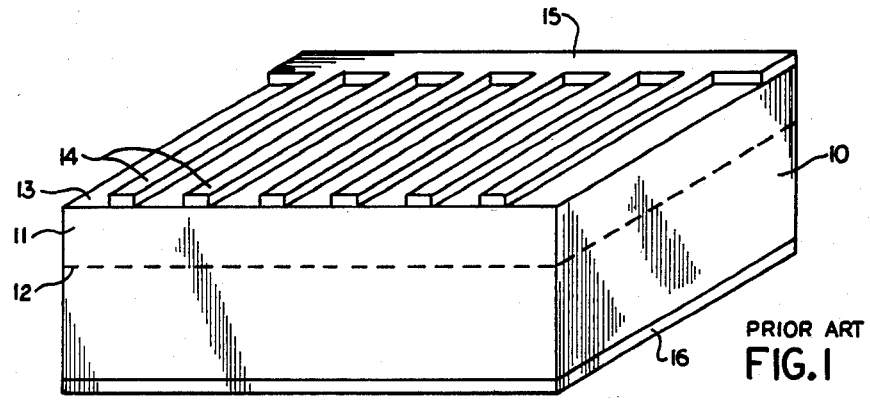
FIG. 1 is a perspective view of a representative example of the conventional N on P solar cell configured in accordance with previous technology.
Figure 2:
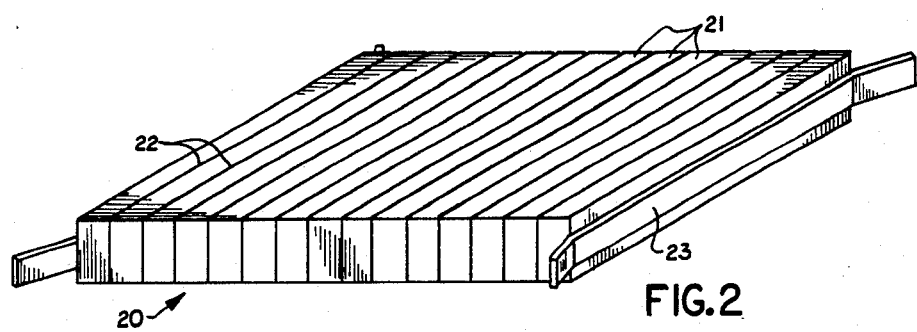
FIG. 2 is a perspective view of a representative example of an array of high intensity solar cells integrally bonded and connected in series, when configured in accordance with preferred embodiment of methods of manufacturing.

In FIG. 2 is shown an enlarged view of an integrally bonded series connected array (20) of high intensity solar cells (21) manufactured in accordance with the preferred embodiment of the present invention. Each high intensity solar cell is integrally adjoined to its neighboring high intensity solar cell by a silicon-aluminum alloy (22) interface. This aluminum alloy region provides mechanical strength, a series electrical interconnection between cells and improved thermal characteristic for each cell under large radiation flux levels. The ends of the high intensity solar cell array (20) have electrical leads (23) attached for output connections.

Figure 3:
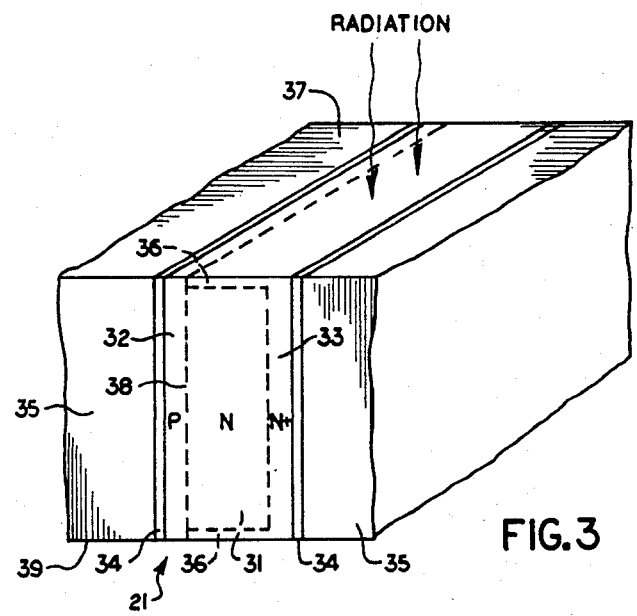
FIG. 3 is a perspective view of a representative example of a single high intensity solar cell configured in accordance with the present invention.

In FIG. 3 is shown an enlarged cross sectional view of a single PNN+ junction high intensity solar cell (21) configured in accordance with the present invention. Each high intensity solar cell is typically 4-12 mils wide and 2 cm long and approximately 10-30 mils thick. For the example shown here, the bulk is N type material (31) in which a P region (32) is diffused to form a PN junction (38), 0.25 to 1.5 mils deep from one side and an N+ layer (33) is diffused from the opposite side. The silicon-aluminum alloy region (34) provides for mechanical and electrical interconnecting of the high intensity solar cell (21) to its adjoining high intensity solar cells (35) which are not shown in detail in this figure. It should be noted that NPP+ high intensity solar cells could also be made according to this invention. The silicon-aluminum alloy region would also provide effective heat sinking of both sides of the high intensity solar cell to an external heat sink.

It is preferred that all exposed surfaces (36) of silicon be passivated by chemical surface treatments, to reduce surface recombination. It is further preferred that the passivation be of such a nature as to create an N+ accumulation layer at all exposed N type silicon surfaces. Such an accumulation layer creates a drift field, further reducing minority carrier recombination at the surfaces. Obviously, for the NPP+ high intensity solar cell, an P+ accumulation layer at all exposed P type silicon surfaces would be required to create a similar reduction of minority carrier recombination at the surfaces. An antireflection coating (37) is applied to the illuminated surfaces.

Figure 4:
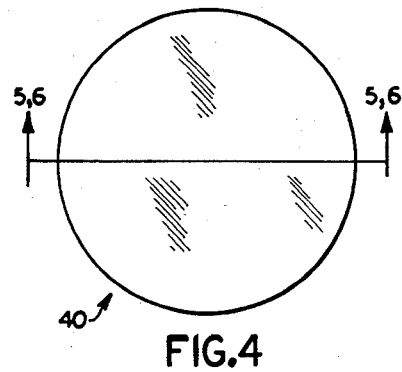
FIG. 4 is a top view of a typical diffused wafer to be assembled in a stack in accordance with the invention.
Figure 5:
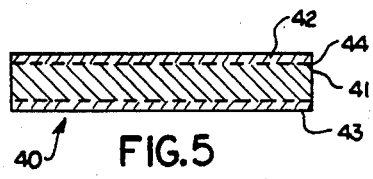
FIG. 5 is a cross sectional view of FIG. 4 taken across the line 5,6—5,6 showing the diffused PNN+ junction formation within each wafer that is used to form high intensity solar cells.

FIG. 5 is a cross sectional view of a PNN+ silicon wafer (40) diffused in accordance with the invention. The wafer starting material is high resistivity N type silicon (41). Into one side, a P layer (42) is diffused to a depth of 0.25 to 1.5 mils and an N+ layer (43) is diffused in the opposite side to a depth that brings the NN+ junction within a diffusion length of the PN junction. The active PN junction (44) lies 0.25 to 1.5 mils into the wafer from the top surface shown in FIG. 4.

Figure 6:
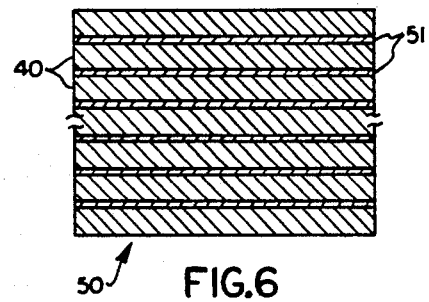
FIG. 6 is a cross sectional view of a representative example of a stack of PNN+ wafers that have been alloyed with aluminum foil interposed between each wafer. Arrays of high intensity solar cells are cut from this assemblage by cutting in planes parallel to line 5,6—5,6 in FIG. 4.

FIG. 6 is a cross sectional view of a stack of PNN+ diffused silicon wafers (40) that have been alloyed together with aluminum foil interposed between each wafer to form an integrally bonded assemblage. This assemblage when cut into parallel slabs along plane 5,6—5,6 will form an array of high intensity solar cells.

Figure 7:
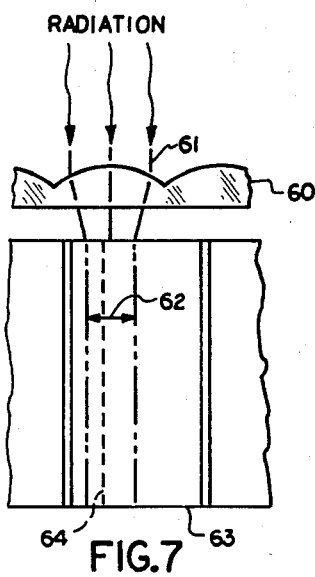
FIG. 7 is a cross sectional view of a representative example of a lens system concentrating incident radiation onto the most sensitive and responsive region of the high intensity solar cell for maximizing output power and efficiency.

FIG. 7 is a cross sectional view of a lens system (60) configured to concentrate incident light (61) into the most responsive region (62) of the high intensity solar cell (63). The most responsive region is the space charge region associated with the PN junction (64) and immediately adjacent to it.

The manufacturing processes in which the above described array of integrally bonded series connected high voltage solar cells is formed is as follows: Referring to FIG. 4, identical wafers (40) of N type single crystal silicon (41) are diffused to form PNN+ junctions as shown in FIG. 5 by any of many techniques well known to those skilled in the art.

These wafers may be round, square, or rectangular in shape and have a thickness of 8 mils or within a range of 4 to 12 mils, (thinner thicknesses present material handling problems) typically with rather high bulk resistivities of 100 to 1000 ohm-cm, to obtain long minority carrier lifetimes and diffusion lengths. Referring to FIG. 5, the P region (42) is diffused from one side to a depth of 1.0 mil or within a range of 0.25 to 1.5 mils and an N+ layer (43) is diffused in the other side of the wafer to a depth that brings the NN+ junction within a diffusion length of the PN junction. The active junction (44) is defined between the P and N regions, while the N+ region forms an area which will accept a low resistance ohmic contact to be formed in the alloying process to follow.

These PNN+ wafers (40) are cleaned and as many as 100 are stacked as shown in FIG. 6 with a 0.5 to 1.0 mil thick sheet of aluminum foil (51) interleaved between each wafer. The wafers are stacked so that the forward and blocking directions of each wafer are oriented in the same direction and preferably rotated so that the crystal orientations of all wafers within the stack are aligned relative to each other. Thereafter, the assembly

(50) is clamped under pressure and is placed in a furnace which is brought up to the eutetic temperature of aluminum-silicon of approximately 650° C. to cause the silicon and aluminum interfaces to alloy. This results in a complete solid assemblage (50) where each PNN+ silicon wafer is integrally alloyed to the wafer on each side of it by the silicon-aluminum alloy interfaces.

There are many materials and processes which are well known to those skilled in the art for preparation of the end surfaces for later connection of electrical leads. For example, during the alloying process aluminum applied to these surfaces would alloy to the silicon and prepare a surface for later welding of aluminum contacts. Alternately, nickel, gold, etc. could be plated on these end surfaces and sintered to the silicon for good electrical and mechanical bonding, thus forming a base for soldering of electrical leads. However, low temperature processes are preferred in order to maintain long minority carrier lifetimes within the wafers.

Thereafter, the assemblage is cut into thin (10 to 30 mils typical) parallel slabs which are perpendicular to the flat wafer surfaces (plane 5,6—5,6 of FIG. 4) so that each of the slabs is composed of sections of the stacked assemblage. The preferred cutting plane should be along the (100) crystal orientation for reduction of surface states. Thereafter, the slabs are trimmed to size (2 cm typically), etched to remove saw damage and shorts caused by metal smearing. Thereafter, surface treatments to passivate the surfaces are applied. However, it is preferred that an accumulation layer be formed over all exposed N type silicon, for PNN+ high intensity solar cells, as the ideal method to minimize surface recombination losses. At this point, leads are attached and antireflection coatings can be applied using processes that are well known by those skilled in the art.

The above described manufacturing processes of the preferred embodiments result in the high intensity solar cell array (20) as shown in FIG. 2. This array consists of a large number of integrally bonded series connected PNN+ high intensity solar cells. The vertical aluminum-silicon alloy regions (22) provide low resistance ohmic interconnections, mechanical strength, and a high thermal conductivity path for effective heat sinking under high intensity conditions. The manufacturing processes of the invention are readily adaptable to techniques for mass production of high intensity solar cell arrays at low cost. In a typical example, 96 high intensity solar cells have been fabricated in an array with approximately 2 cm×2.4 cm overall dimensions using diffused 10 mil PNN+ wafers as starting material. The resultant array of high intensity solar cells is capable of generating voltages and current at maximum power of more than 37 volts and 260 mA under intensities of approximately 250 solar constants, with efficiencies greater than 6 percent. This represents power output densities of greater than 2 watts/cm$^2$ and voltage densities of greater than 15 volts/cm. In addition, each high intensity solar cell is operating with a current density of greater than 5.5 ampere/cm$^2$. Thus the requisite efficient energy conversion at high intensity is secured with high voltage and current densities.

Refer now to FIG. 3, which shows a high intensity solar cell (21) that results when manufactured in accordance with the present invention. The N type bulk material (31) is still representative of the high wafer starting resistivities of 100 to 1000 ohm-cm utilized to obtain long minority carrier lifetime and diffusion length in this region. The dimensions of each high intensity solar cell were established during the manufacturing process as follows: (a) the width is determined by the thickness of each starting wafer (40), (b) the depth is determined by the etched slice sawn in the cutting of the alloyed assemblage (50), and (c) the length is again determined by the trimming cuts of the slabs. The P region (32) and the N+ region (33), diffused on opposite sides are still representative of the original wafer diffusions. Each side of the high intensity solar cell is metallized with the silicon-aluminum alloy (34) representative of the original alloying of the assemblage stack. The surface treatments applied after the cutting and etching processes passivate the exposed surfaces (36) upon which antireflection coatings (37) are applied. It should be noted that NPP+ diffused wafers could also be used to form high intensity solar cells in accordance with this invention.

The structure of the high intensity solar cell provides parallelly illuminated junctions rather than the perpendicularly illuminated junctions of the conventional silicon solar cell. In a series connected array of high intensity solar cells the output current is largely determined by the poorest cell within the series; hence, the desirability of keeping each cell identical during its formation in the manufacturing processes. Because of symmetry, illumination of the upper surface or lower surface or both surfaces simultaneously will provide photovoltaic characteristics.

Let us look at some of the novel aspects of the high intensity solar cell. The use of high resistivity bulk material provides long minority carrier lifetimes and diffusion lengths in the N region. Ideally, one would want the diffusion length to exceed the wafer thickness; however, with all the high temperature processing of diffusion and alloying, this is not possible to achieve. The diffusion length determines the greatest distance from the junction plane at which minority carriers generated by the radiation can reach the junction and be separated by the potential barrier before they recombine. Thus, the active region of the high intensity solar cell is that region falling within the minority carrier diffusion lengths of the junction in both the P and N regions. However, the most responsive portion of this structure would be for carriers generated within the depletion or space charge region of the junction and immediately adjacent thereto. This responsiveness has been verified experimentally using beam scanning techniques, which has shown that the peak sensitivity may be 2–3 times the average. Refer now to FIG. 7, which shows a representative example of a lens system configured to concentrate incident radiation normally falling uniformly upon each cell into the most sensitive region of each high intensity solar cell in order to increase output power and efficiency. Such a lens system could be configured and applied in a fashion similar to cover glasses presently applied to conventional silicon solar cells for radiation protection. However, instead of flat cover glasses, these lenses, for example, could be molded for a given array of high intensity solar cells. Experimental tests with a simple lens system consisting of cylindrical glass fibers laid over each high intensity solar cell in an array showed a 25 percent increase in short circuit currents using this concept. It is obvious that one skilled in the optics art could design a more superior lens system than this example and that an optimum placement over the array of high intensity solar cells would be required for maximum performance.

With the structure provided by the high intensity solar cell, the upper surface being passivated and provided with an accumulation layer will offer improved response to the short wavelength radiation absorption when compared to the conventional silicon solar cell. This is because the upper surface is not a highly doped or dead region as in the conventional silicon solar cell but a region of passivated surface states with a drift field. In addition, electron-hole pairs that are generated deep within the structure can still lie within a diffusion length of the junction plane, and therefore the response of the cell to longer wavelengths up to 1.1 micron is secured; whereas, in the conventional solar cell the peak response typically occurs at 0.85 to 0.90 microns and falls off rapidly.

High intensity solar cells can be optimized for efficiency and spectral response by both material and geometrical considerations. Obviously, an optimized PNN+ structure would differ from an optimized NPP+ structure because of the differences in absorption coefficients, minority carrier mobilities, lifetimes, surface recombination, etc. However, thermal problems are minimized, even for an optimized geometry that is thicker, with the interposed vertical aluminum-silicon alloy region, since heat generated within the high intensity solar cell can flow laterally toward this aluminum region from the silicon and this region provides a higher thermal conductivity path to the heat sink (assumed provided to the lower surface). In addition, the structure provides a transparent window to all radiative wavelengths in excess of 1.1 micron. Since these wavelengths will not be absorbed within the silicon and the lower surface is not opaque, this energy will pass through the high intensity solar cell without generating additional heat and be absorbed in the attached heat sink below the lower surface. The portion of the solar radiation with wavelengths greater than 1.1 microns is approximately 25 percent of the total solar radiation. This energy is useless to the silicon photovoltaic conversion process and in the conventional silicon solar cell is largely absorbed in the opaque back contact region, thereby generating additional heat in the cell.

This invention, alternately, provides a structure whereby if one desires to minimize the thermal energy transmitted to the heat sinking, a reflecting surface (39) can be applied on the lower surface to reflect this unusable energy in excess of 1.1 micron away from the heat sink and back out the front surface toward the source. This would minimize thermal cooling requirements for those installations where the thermal energy cannot be utilized.

In the conventional silicon solar cell, low resistivity bulk material is necessary to minimize the series resistance with impurity donor concentrations quite high, on the order of $10^{16}$/cm$^3$ for 1.0 ohm-cm material. However, with the parallel illuminated junction structure provided by the high intensity solar cell, the high resistivity of 100 to 1000 ohm-cm has impurity donor concentrations much smaller, on the order of $10^{13}$ to $10^{14}$/cm$^3$. Under intense illumination of 100 AMO suns, the photons generate carriers at a rate exceeding $10^{19}$/cm$^2$-sec across the entire upper surface region of the cell (from contact to contact). With the long lifetimes associated with high resistivity material, this corresponds to a high level of injected carriers; therefore, the effective series resistance of this structure is modulated by the photoconductivity effects even in the bulk regions beyond the diffusion length of the junction. The higher the intensity, the higher the photoconductivity effects and the smaller the effective series resistance of the cell. Thus, the high intensity solar cell series resistance is not controlled by the bulk resistivity consideration as is the case in the conventional silicon solar cell, but is modulated by the incident radiation.

The P region diffused from one side to a depth of 0.25 to 1.5 mils is more than an order of magnitude deeper than in the conventional silicon solar cell. In addition, the area of the junction of the structure provided by the high intensity solar cell may exceed the area of the upper surface when optimized for performance. For example, if 10 mils is the width and 20 mils is the thickness of each cell, the area of the junction will be 2 times the area of the upper surface and an additional 50 percent reduction in the resistance of the P region will result. Thus in optimizing the high intensity solar cell, considerable reduction in effective series resistance associated with the diffused region is offered by this structure, which was the paramount limitation in the conventional silicon solar cell design for high intensity. In addition, this structure with deep diffused junction does not affect the spectral response since the illumination is parallel to the junction.

The high intensity solar cell structure with the aluminum-silicon alloyed region provides 100 percent electrical current collecting coverage on both sides of the cell's PN junction without any loss to the light collecting surfaces. Again, this aspect was one of the prime limitations in design of the conventional silicon solar cell for high intensity. Considering also that, for example, when the high intensity solar cell junction area may be a factor of two times that of the upper surface area along with the 100 percent coverage, the structure provided by the high intensity solar cell represents a considerable improvement in current collection effectiveness on the diffused side.

The N+ diffusion can provide several functions, in addition to being necessary for establishing an ohmic electrical contact region for the aluminum alloying to silicon. A deep and gradual diffusion profile properly done will provide a built-in electrostatic drift field that will enhance the minority carrier movement toward the junction barrier and in effect will enhance minority carrier contribution from the region beyond the normally considered diffusion length.

Another important aspect of the high intensity solar cell structure is that the device is more responsive than the conventional silicon solar cell to radiation incident at angles other than normal. In most concentrating systems, such as mirror reflectors or lenses, the concentrator will track the sun and concentrate the direct incident light falling on the surface of the concentrators onto the surface of the high intensity solar cells. Therefore, in any simple optical system the sun's rays will no longer be parallel but will be focused. Depending upon the focal length of the concentration system, the radiation energy will now be in the illumination contained in all angles within the space formed by collecting areas and the focal planes or points. Consider the two extreme conditions for a simple concentrating lens where the illumination is to be contained in a cone-shaped configuration: (1) in the plane of the junction—those components both of short and long wavelengths down the plane of the junction contribute directly because there is no dead layer on the upper surface; and (2) across the plane of the junction—the short wavelengths again contribute because of no dead layer on the upper surface; however, the longer wavelengths can be reflected internally from the alloy region and be confined within the solar cell to contribute to output current.

In summary, it should be noted that the high intensity solar cell in accordance with this invention differs considerably and eliminates almost all the problems encountered with conventional silicon solar cells while offering improved characteristics at high radiation intensities.

The prime problem of the conventional silicon solar cell described in the background of the invention being the series resistance is largely overcome. The electrical current collecting contacts cover the entire end areas of each side of the high intensity solar cell junction without blocking any incident radiation on the illuminated surfaces. The diffused layer for formation of the P-N junction is deep, thus greatly reducing the resistance normally associated with the diffused region without compromising spectral response since parallel illumination of the junction is utilized. The parallel illuminated junction offers improved spectral response for the shorter ultraviolet wavelength radiation incident on the exposed surfaces that have been passivated or treated to form an accumulation layer, while offering a new response to the longer infrared wavelength radiation. The high resistivity bulk region greatly increases the diffusion lengths and minority carrier lifetimes in that region; however, under high intensity illumination the conductivity is controlled by the high level injection of photon generated carriers. With the parallel illuminated junction structure provided, photon absorption is essentially uniform across the entire device (from contact to contact), thus its conductivity is modulated by light injected carriers. The higher the intensity, the lower the resistance of the cell.

It is recognized that surface recombination losses are the major source of losses in a vertical junction device, thus with this structure the use of high resistivity materials with properly passivated surfaces and an accumulation layer to provide a drift field will minimize these losses and offer improved performance.

The N+ diffusion necessary for providing ohmic resistance contacts to the silicon will, in addition, improve the parallel illuminated junction device by providing an internal drift field if it is deep enough to enhance the minority carriers drift toward the junction and its ultimate collection by the potential barrier.

The aluminum-silicon alloyed interfaces provide improved electrical, mechanical, and thermal characteristics to the high intensity solar cells. Thermal dissipation within the silicon can flow laterally into the aluminum interfaces in addition to the vertical direction, thus improving the thermal stability of this cell under high illumination. It should be emphasized that this structure is transparent to wavelengths in excess of 1.1 micron, which represents approximately 25 percent of the solar energy, thus greatly improving the situation under high intensity.

While the present invention has been described in terms of a solar cell, it should be understood that it is equally useful in producing other photovoltaic devices, such as laser radiation converters, thermo photovoltaic converters, etc. which have essentially the same characteristics as solar cells. It is to be understood that only preferred embodiments of the invention have been described and that numerous substitutions, alternatives, and modifications are permissible without departing from the scope of the invention as defined in the following claims.

What is claimed is:

1. A method of manufacturing an array of integrally bonded, series connected matrix of high intensity solar cells, comprising the steps of:
    (a) Forming identical PNN+ (or NPP+) junctions to a depth of approximately 0.001 inch into flat wafers of high resistivity N type (or P type) silicon of more than 100 ohm-cm with a thickness of approximately 0.008 inch with the PNN+ junctions lying in the plane of the wafers;
    (b) Stacking these PNN+ wafers with approximately 0.001 inch aluminum foil interposed between each wafer and with each wafer's PNN+ junction and crystal orientation orientated in the same direction;
    (c) Alloying the silicon wafers and aluminum interfaces under pressure at eutectic temperatures so that the stacked assemblage will be integrally bonded together;
    (d) Preparing the end surfaces of later connection of electrical leads by metallization;
    (e) Cutting the said assemblage into a plurality of slabs having a thickness of approximately 0.020 inch by cutting it along parallel planes extending perpendicular to the plane of the said wafers, then cutting to trim each slab to the desired length;
    (f) Etching the cut surfaces of said slabs to remove damage and metal smeared across the junctions;
    (g) Treating the exposed silicon to passivate and prepare an accumulation layer to the surfaces;
    (h) Attaching electrical leads to each end of the slab; and
    (i) Applying antireflection coatings.

2. A method of manufacturing a high intensity edge illuminated solar cell comprising the steps of:
    (a) forming a semiconductor substrate with first, second and third essentially parallel layers of impurity doped semiconductor material and arranged in that order with said first and third layers terminating in opposing essentially parallel first and second major surfaces;
    said second layer being of a first type conductivity and said first layer being of an opposite second type conductivity so as to define a PN junction between said first and second layers and which junction is essentially parallel to said first and second major surfaces;
    said third layer being of said first type conductivity but of greater impurity concentration than that of the second layer for providing a built-in electrostatic drift field to enhance minority carrier movement towards the PN junction;
    the junction of said second and third layers being essentially parallel to said PN junction;
    (b) applying first and second ohmic contact layers on said first and second major surfaces respectively so as to provide electrical contacts thereon;
    (c) separating said substrate along separating planes into segments, the separating planes providing major working surfaces extending between the said first and second said major surfaces, said major working surfaces each containing a plurality of edge surfaces of said first, second and third impurity doped semiconductor material;
    (d) preparing the major working surfaces of each said segment by passivating the edge surfaces of said first, second and third impurity doped material, at least one of the said major working surfaces serving for receiving incident radiation and thereby serving as an operating surface; and (e) incorporating an accumulation layer at said operating surface containing said first type conductivity semiconductor material to provide thereat a drift field to minimize minority carrier recombination at the operating surface.

3. A method as set forth in claim 2, wherein said step of preparing the major working surfaces includes removing surface damage caused in the separation of said substrate into said segments.

4. A method as set forth in claim 2 including the step of applying an anti-reflection coating on said operating surface to minimize reflection of incident radiation.

5. A method as set forth in claim 2 wherein said major working surfaces are defined by separating planes along the (100) crystal orientation of the semiconductor material substrate.

6. A method as set forth in claim 2 that includes at least two operating surfaces so that they may be simultaneously illuminated with incident radiation.

7. A method as set forth in claim 2 wherein one of said major working surfaces serves as said operating surface to receive incident radiation from a radiant energy source and the further step of applying reflective means to a second said working surface so that it serves as a reflecting surface to reflect radiation, not absorbed, which has penetrated the cell back towards the source of radiation.

8. A method as set forth in claim 2 for making an array of said solar cells comprising the steps of:
   forming a plurality of essentially identical said substrates;
   aligning said substrates in a series stack such that the first and second major surfaces of an intermediate substrate respectively face the second and first major surfaces of the preceeding substrate and the next succeeding substrate;
   mechanically bounding and electrically interconnecting adjacent substrates to each other.

9. A method as set forth in claim 8 wherein said step of mechanical bonding and electrical interconnecting adjacent substrates includes using metallic bonding material.

10. A method as set forth in claim 2 wherein the junction of said second and third layers is spaced essentially within a minority carrier diffusion length from said PN junction.

11. A method as set forth in claim 2 including the further step of incorporating a said accumulation layer at said first type conductivity semiconductor material of all said major working surfaces to provide thereat a drift field to minimize minority carrier recombination.

* * * * *